US005637539A

United States Patent [19]

Hofmann et al.

[11] Patent Number: 5,637,539

[45] Date of Patent: Jun. 10, 1997

[54] VACUUM MICROELECTRONIC DEVICES WITH MULTIPLE PLANAR ELECTRODES

[75] Inventors: Wolfgang Hofmann, Ithaca, N.Y.; Liang-Yuh Chen, Santa Clara, Calif.; Noel C. MacDonald, Ithaca, N.Y.

[73] Assignee: Cornell Research Foundation, Inc., Ithaca, N.Y.

[21] Appl. No.: 586,057

[22] Filed: Jan. 16, 1996

[51] Int. Cl.$^6$ .......... H01L 21/461; H01J 9/00

[52] U.S. Cl. .......... 438/20; 445/24; 445/50; 445/51; 438/619

[58] Field of Search .......... 216/11, 39, 41; 437/228; 313/309, 310, 351; 445/24, 50, 51

[56] References Cited

U.S. PATENT DOCUMENTS

| | | | |
|---|---|---|---|
| 4,008,412 | 2/1977 | Yuito et al. | 313/309 |
| 5,186,670 | 2/1993 | Doan et al. | 445/24 |
| 5,199,917 | 4/1993 | MacDonald et al. | 445/24 |
| 5,201,992 | 4/1993 | Marcus et al. | 216/11 |
| 5,316,511 | 5/1994 | Lee | 445/24 |
| 5,394,006 | 2/1995 | Liu | 257/506 |

OTHER PUBLICATIONS

Chen, et al,"Surface Micromachined Multiple Level Tungsten Microstructures," Solid–State Sensor and Actuator Workshop Hilton Head, S.C. Jun. 13–16, 1994 pp. 99–102.

Macdonald et al, "Selective Chemical Vapor Deposition of Tungsten for Microelectromechanical Structures," Sensors and Actuators, 20 (1989) 123–133.

Brodie, et al, "Vacuum Microelectronics," Advances in Electronics and Electron Physics, vol. 83, 1992.

Busta, Heinz H., "Vacuum Microelectronics"—1992, J. Micromech. Microeng. 2 (1992) pp. 43–74.

Busta, et al, "The Field Emitter Triode as a Displacement/Pressure Sensor," M. Micromech. Microeng. 3 (1993) pp. 49–56.

Vaudaine, et al, "Microtips" Fluorescent Display, 1991 IEEE, pp. 8.1.1—8.1.4.

Greene et al, "Vacuum Integrated Circuits," IEDM 85, pp. 172–175, 1985.

Chang, et al, "A Scanning Tunneling Microscopes Based microcolumn System," Jpn.J.Appl.Phys.Vol. 31 (1992) Pt. 1, No. 12B, pp. 4232–4240.

Crewe, et al, "Micromachined Electrostatic Electron Source," J. Vac. Sci. Technol. B 10(6), Nov./Dec. 1992, pp. 2754–2758.

Spindt, et al, "Physical Properties of Thin–Film Field Emission Cathodes with molybdenum Cones," J. Appl. Phys. vol. 47, No. 12 Dec. 1976, pp. 5248–5263.

*Primary Examiner*—R. Bruce Breneman
*Assistant Examiner*—Anita Alanko
*Attorney, Agent, or Firm*—Jones, Tullar & Cooper, P.C.

[57] ABSTRACT

A fabrication process for vacuum microelectronic devices having multiple electrode levels includes production of a first-level electrode mask on a substrate. The mask pattern is transferred to the substrate to produce a trench surrounding an emitter which is formed by thermal oxidation. The trench is filled with tungsten to form a gate electrode surrounding the emitter, and the resulting wafer is planarized. A second-level electrode is formed on the top surface of the wafer, and is planarized. Additional levels are similarly produced, and thereafter the electrodes are released.

10 Claims, 4 Drawing Sheets

VACUUM MICROELECTRONIC DEVICES WITH MULTIPLE PLANAR ELECTRODES

BACKGROUND OF THE INVENTION

The present invention relates, in general, to integrated vacuum microelectronic devices, and more particularly to the fabrication of microelectronic sources and source arrays consisting of silicon or silicide field emitters and multiple planar electrodes.

The field of vacuum microelectronics grew out of the application of microfabrication technology, which was developed for solid-state electronic devices, to vacuum devices. Early work focused on the fabrication of field emitter arrays, but progress in fabrication technology has let to the investigation of a variety of new devices in high-speed electronics, flat panel displays, sensors including field emission and other tunneling sensors, and electron optics including microelectrostatic lenses and microcolumns.

The processes and devices developed so far all suffer from the crucial limitation that they are non-planar. For example, arrays of electronoptical microcolumns have been proposed as a massively parallel approach to the throughput bottleneck in electron beam lithography. However, previous implementations have required a complex assembly of separately fabricated pieces with resulting difficulties in alignment which limit the achievable parallelism. These difficulties limit designs with vertical field emitters to a single gate or extraction electrode, with additional electrodes having to be located on additional substrates. Alternatively, lateral emitter designs have been developed to allow multiple electrodes, but these are limited in feature size by lithography technology.

SUMMARY OF THE INVENTION

Briefly, the present invention is directed to a novel process for the fabrication of vacuum microelectronic devices consisting of silicon tip emitters with multiple planar electrodes, and further to the integration of such devices with electronoptical microcolumns on a silicon substrate. The process allows the fabrication of multiple levels of control electrodes surrounding and aligned with an emitter on a substrate without the feature size penalty incurred by lateral-emission designs. The electrodes may be connected to external circuitry, which may be located on the same substrate, to form an electron lens for controlling an emitted electron beam.

The fabrication process of the present invention is based on the selective tungsten CVD technology described in U.S. Pat. No. 5,149,673, issued Sep. 22, 1992, to Noel C. MacDonald et al. In accordance with the present invention, silicon dioxide and silicon nitride films are deposited on a silicon substrate and patterned using photolithography and reactive ion etching. The pattern in the films serves as a mask for an anisotropic undercut etch of the silicon substrate by reactive ion etching to produce a trench surrounding an emitter site. An emitter tip having a tip radius of about 20 nm is then formed by thermal oxidation of exposed silicon, leaving a trench lined with silicon dioxide to form a mold for receiving a metal electrode. In a preferred embodiment-of the invention, the metal is tungsten, and in this embodiment, a silicon seed layer is implanted in the trench mold to enable the tungsten to be selectively deposited in the mold. The silicon implant in the trench is followed by a stripping of the silicon nitride film. This creates a silicon-rich silicon dioxide sacrificial layer on the surfaces of the etched trench. The implanted layer serves as a seed layer for a selective tungsten CVD which fills the trench to form a first, self-aligned, metal gate electrode around the emitter tip. The spacing between the emitter and the gate electrode, and thus the diameter of the gate electrode, is determined by the thickness of the silicon dioxide layer covering the tip.

Thereafter, mechanical and chemical polishing is used to completely planarize the surface of the substrate, and additional levels of electrodes are integrated by repeating a slight modification of the foregoing steps, utilizing additional trenches, or molds, formed in electrically insulating sacrificial layers. Following the formation of the electrode levels, the sacrificial insulating layers are removed to release the electrodes and expose the emitter tip. This is accomplished by providing an etch mask on the topmost electrode layer, and removing the insulating layer surrounding the electrode structures by a vertical MIE etch. Thereafter, the insulating material beneath the electrodes is removed by a wet etch step to release them, leaving suspended electrode structures around and aligned above the emitter tip.

The first level gate electrode is self-aligned to the tip emitter and has a submicron aperture diameter, which is crucial for low-voltage operation. The planar nature of each metal level allows the fabrication of multiple levels of planar electrodes on top of the emitter structure, all on a single substrate and aligned with the emitter. The number of electrode levels that can be fabricated in this manner is limited only by the properties of the materials used. Mechanical properties such as stress and adhesion and related properties such as thermal expansion are important considerations because the metal electrodes are suspended above and in alignment with the emitter.

The silicon substrate used in the present invention is low-cost silicon, and may be single crystal silicon, and the fabrication process relies on well-understood integrated circuit fabrication technology. The electrodes are formed preferably by selective chemical vapor deposition (CVD) of tungsten into the trench/mold which surrounds the emitter, but other selective deposition technologies and even some non-selective ones utilizing metals or alloys other than tungsten can be used as well. The electrical characteristics of the sacrificial layer material, which forms the lining of the trench, or mold, are important, since this material forms the electrical insulation between the various metal layers, and between the metal and the substrate.

Although the invention is described in connection with fabrication of a single emitter with multiple electrode levels, it will be understood that arrays of emitters may be fabricated on a single substrate.

The process of the present invention can be integrated with microelectromechanical systems (MEMS) such as that described in copending U.S. patent application Ser. No. 08/069,725 of Z. Lisa Zhang and Noel C. MacDonald, filed Jun. 1, 1993, now U.S. Pat. No. 5,536,988, to permit controlled motion and alignment of individual electrodes or to permit controlled motion of entire device structures. Furthermore, the tungsten CVD process is low temperature, and thus is compatible with CMOS and interconnect technologies to allow the integration of drive and control electronics on the same wafer as the tip emitters.

The process of the present invention allows the fabrication of arrays of silicon tip emitters with integrated electrostatic lenses on a single silicon wafer. An entire micromachined electron beam source, or electron gun, or other vacuum microelectronic devices such as microtriodes or field emitter displays can be fabricated utilizing multiple levels of complex, suspended tungsten or other metal microstructures.

BRIEF DESCRIPTION OF THE DRAWINGS

The foregoing, and additional objects, features and advantages of the invention will be apparent to those of skill in the art from the following detailed description of a preferred embodiment, taken in conjunction with the accompanying drawings, in which.

DESCRIPTION OF PREFERRED EMBODIMENTS

Figure 1:
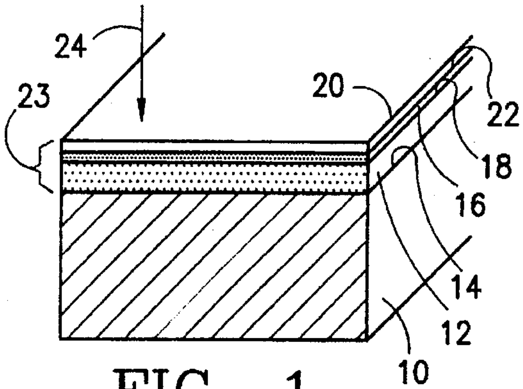
FIGS. 1–6 illustrate, in diagrammatic perspective form, the steps in a process for fabricating an emitter and a surrounding first-level planarized self-aligned aperture electrode in accordance with the present invention.

Turning now to a more detailed consideration of the drawings, there are illustrated in FIGS. 1–6 the steps of a process for fabricating an emitter and a first-level planarized electrode surrounding the emitter. The starting material for this process is a substrate 10 of a low resistivity n-type silicon, preferably having a resistivity of less than about 0.005 ohm/cm. The process begins by depositing thermal wet silicon dioxide ($SiO_2$) as a first layer 12 on the top surface 14 of the substrate 10. This layer may have a thickness of, for example, about 100 nm. Following this, a layer 16 formed by low pressure chemical vapor deposition (LPCVD) of silicon nitride ($Si_3N_4$) is deposited on the top surface 18 of layer 12 to a thickness of, for example, about 200 nm. The layers 12 and 16 are dielectric films that serve as etch and implantation masks, respectively, in later processing steps. The implantation mask layer 16 can be a material other than $Si_3N_4$, but has to satisfy two conditions: namely, there has to be a method of patterning the layer vertically (i.e., without undercut), and there must be a way of stripping this layer with a very high selectivity to silicon dioxide and silicon.

A third layer 20 of plasma-enhanced CVD $SiO_2$ is deposited to a thickness of, for example, about 150 nm on the top surface 22 of layer 16 to form a dielectric stack generally indicated at 23. A conventional photolithographic process, indicated by arrow 24, is used to define patterns 26 (FIG. 2), which are transferred to the dielectric stack 23 by a vertical reactive ion etch (RIE) using $CHF_3$ plasma, indicated by arrow 27. The top $SiO_2$ layer 20 serves as an etch mask in the subsequent undercut etch, to be described. It is noted that the lithography step may be performed by 10:1 projection lithography, although other methods such as electron beam lithography are equally applicable. Furthermore, although an RIE process utilizing $CHF_3$ is usually used to pattern the dielectric stack 23, other gas ambients and other vertical etches such as ion milling, chemically assisted ion beam etching, ECR, and the like are also applicable. Factors affecting the choice of patterning techniques and materials are the anisotropy of the etch, the etch rate, and the selectivity to the masking material.

Figure 2:
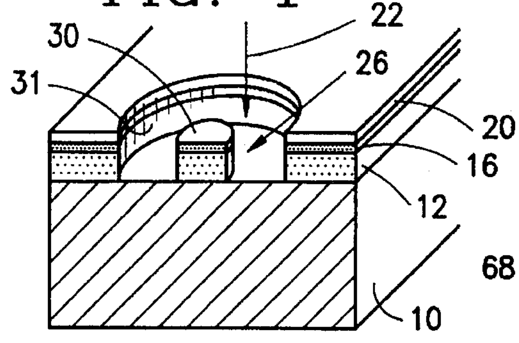
Figure 3:
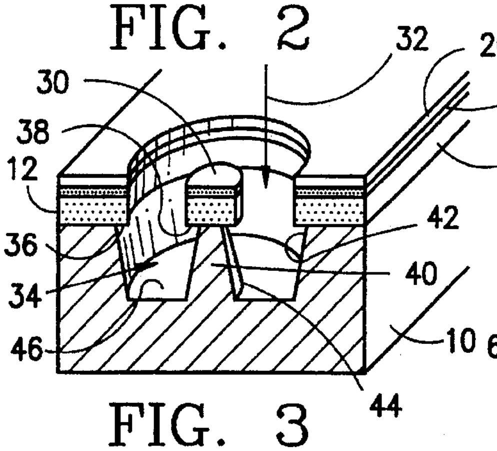

As illustrated in the perspective view of FIG. 2, the pattern 26, which may be in the form of an annulus, defines the shape of an electrode which will surround an emitter to be formed within a central island 30. The island is surrounded by a dielectric-free channel 31. Although the pattern illustrated in this figure is annular, having a circular periphery and defining a circular emitter island, other electrode and emitter shapes may be defined. The dielectric layer 20 serves as an etch mask for an anisotropic undercut etch of the silicon substrate, indicated by arrow 32 in FIG. 3. This undercut etch is an RIE utilizing $SF_6$, with the parameters of the etch affecting the etch depth and the anisotropy. Alternatively, the undercut etch can be performed by a wet etch, or by using RIE in a $Cl_2/BCl_3/O_2$ ambient. The undercut etch produces a trench 34 in the silicon substrate 10 which has the shape of mask pattern 26 and which preferably has a depth of from about 0.7 to 1 micrometer. This etch undercuts the mask layer 12, as indicated at 36 and 38, by approximately 0.5 micrometers, and forms a tapered support post 40 for island 30 in the center of (i.e., surrounded by) trench 34. The undercut etch provides substantially vertical, but slightly tapered outer and inner walls 42 and 44 for trench 34, with the outer trench wall 42 tapering generally upwardly and outwardly from a trench floor 46. The inner trench wall 44 tapers generally upwardly and inwardly from floor 46 to form, in the illustrated embodiment, a conical post 40 with a generally circular cross-section.

Figure 4:
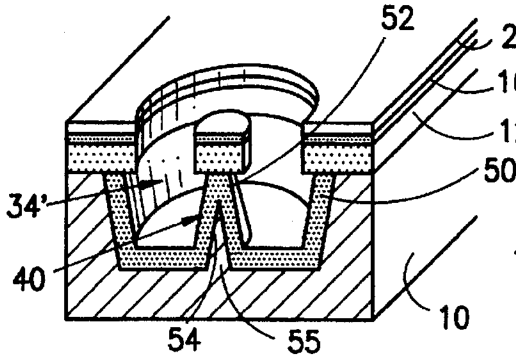

An emitter tip is formed from post 40 by a wet thermal oxidation of the silicon substrate 10 which is exposed at walls 42 and 44 and floor 46 of trench 34. As illustrated at FIG. 4, thermal oxidation produces a silicon dioxide layer 50 on both the inner and outer walls of the annular trench 34 as well as at the floor thereof. The oxide layer 50 narrows the trench 34, and defines a mold cavity 34' for receiving the electrode metal to be deposited. The layer 50 has a typical thickness of about 400 nm, or slightly greater than 1.4× the smallest radius of the generally conical silicon post 40, so that the top of the tapered post is oxidized completely through its diameter, as illustrated at 52 in FIG. 4. This leaves a conical silicon emitter tip 54 and shank 55 within post 40 and surrounded by the silicon dioxide layer 50. The geometry of the silicon tip emitter and shank is controlled by the undercut etch of FIG. 3 and the thermal oxidation step of FIG. 4. The etch conditions allow variation in various geometrical aspects of the emitter, such as the tip radius, half-angle, height of the shank, etc.

Figure 5:
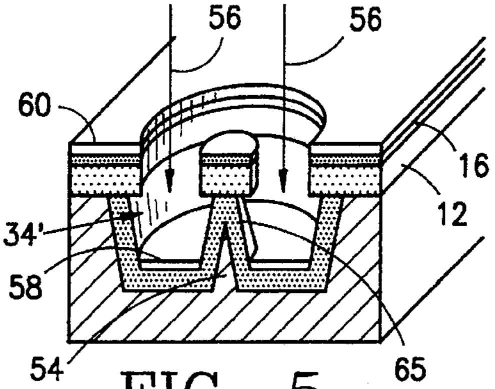

The thermal oxidation step of FIG. 4 is followed by a shallow silicon ion implant step, generally indicated by arrows 56 in FIG. 5, the ion implant being provided, for example, at a dose of $10^{17}$ $cm^{-2}$ at 40 keV. The implant layer is illustrated at 58 in FIG. 5 on the floor of the mold cavity 34'. The implant also produces in layer 20 a thin layer 60 of silicon and silicon dioxide on the top surface of the silicon nitride layer 16, again as illustrated in FIG. 5.

Figure 6:
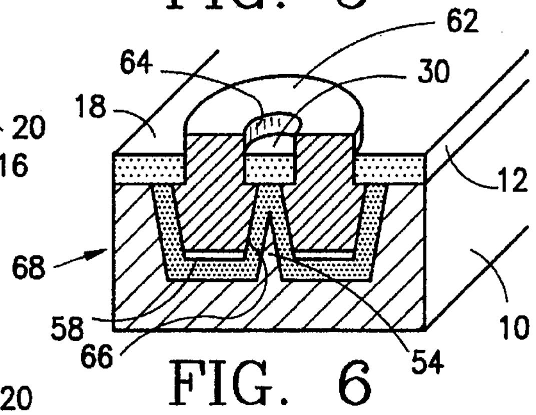

The silicon nitride layer 16, the silicon dioxide layer 20, and the thin layer 60 are stripped away using a hot (155° C.) phosphoric acid, and the wafer is briefly dipped in a dilute buffered hydrofluoric acid to remove a thin $SiO_2$ layer which forms on the silicon implant surface 58. This leaves the silicon dioxide layer 12 on top of wafer 10, and leaves the silicon-rich layer 58 at the floor of cavity 34' as illustrated in FIG. 5. The silicon-rich surface serves as a seed layer for receiving a selective tungsten CVD 62 (FIG. 6). The $SiO_2$ layer 12 prevents deposition of tungsten on the remaining surfaces of the wafer. The tungsten bonds only to the seed layer or to itself, and fills the trench 34 to form a first-level gate electrode which is self-aligned with the emitter. The deposited metal takes the shape of the previously defined trench 34, with a central aperture 64 centered over island 30.

The structure of FIG. 6 is illustrated with the layers 16, 20, and 60 removed and with the bottom of the metal layer 62 being in contact with the seeded layer 58. The metal surrounds the emitter 54 and is spaced from the emitter by a distance equal to the thickness of oxide layer 50. The tapered surface 65 (FIG. 5) of oxide layer 50, corresponding to wall 44, defines the inner diameter 66 (FIG. 6) of the deposited metal so that a central gate aperture is provided through which the emitter 54 extends. This inner diameter 66 defines the diameter of the gate electrode aperture produced by the present process and is determined by the undercut etch and the thermal oxidation steps. It is equal to the diameter of the narrowest part of the oxidized tapered Silicon pillar 40. This structure, including substrate 10, layer 12 and electrode 62, is referred to as a wafer 68.

Figure 7:
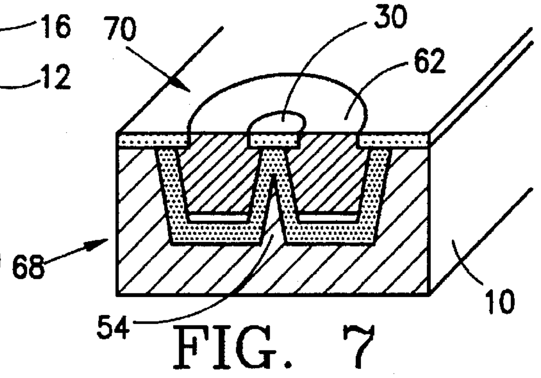
FIGS. 7–12 illustrate steps in a process of fabricating a second-level planarized electrode for the device of FIG. 6.

As illustrated in FIG. 7, the next step in the process is a planarization of the wafer 68. This is accomplished by mechanical polishing and chemical etching of the now-exposed top surface 18 of oxide layer 12, together with that portion of the electrode 62 which extends above surface 18. The polishing and etching step reduces the thickness of layer 12 and reduces the vertical height of electrode 62, as illustrated in FIG. 7, to provide a planarized top surface generally indicated at 70 for wafer 68, completing the fabrication of the gated emitter, with the emitter tip 54 and the electrode 62 embedded in the silicon substrate 10 and the sacrificial silicon dioxide layer 50. In order to add additional electrodes, a variation of the foregoing process is repeated, as illustrated in FIGS. 8–12. For simplicity, these figures are illustrated in section view, rather than the perspective views of FIGS. 1–7, but it will be understood that, in the preferred form of the invention, the electrodes formed in the following steps will be generally annular and coaxial with the emitter 54. Furthermore, it will be understood that although a single emitter is illustrated, multiple emitters and corresponding electrodes may be fabricated on substrate 10.

Figure 8:
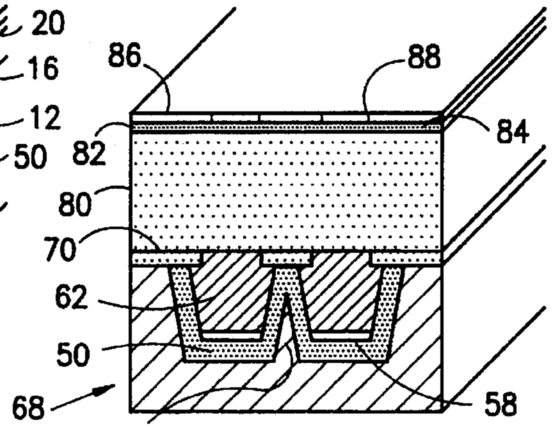

The steps in fabricating a second-level electrode are illustrated in FIGS. 8–11, to which reference is now made. This is a modular process which allows fabrication of multiple-level suspended metal microstructures by repeating an identical sequence of fabrication steps for each level. The process is initiated by depositing on the planarized top surface 70 a thick film of low-temperature silicon dioxide 80 which will serve as a sacrificial mold layer. Its thickness is equal to the thickness of the metal electrodes which are to be formed in the second level, plus the vertical spacing desired between the first and second levels. Thereafter, a layer 82 of low pressure CVD (LPCVD) silicon nitride is deposited on the top surface 84 of layer 80, to a thickness of about 150 to 200 nm, for example, as illustrated in FIG. 8.

Figure 9:
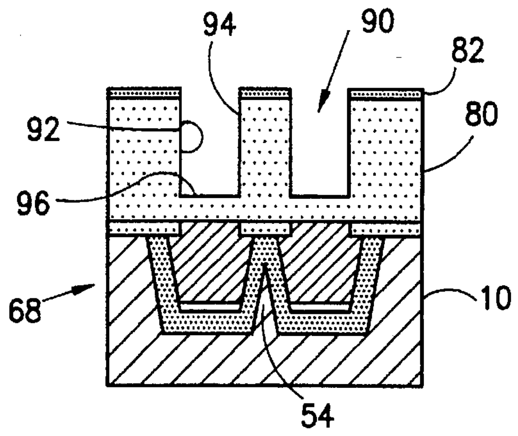
Figure 12:
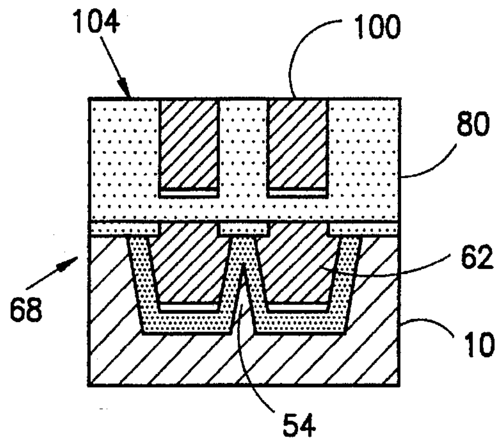

A resist layer 86 is then spun onto the top surface of layer 82 and is patterned, as at 88, through suitable lithographic steps to define a resist mask pattern for the second-level electrode microstructure. This pattern is transferred from the resist to the silicon nitride and silicon dioxide layers 82 and 80 by magnetron ion etching (MIE) using $CHF_3$. This is a vertical etch having a high selectivity to the resist mask, a high degree of anisotropy, and a high etch rate. The etch depth determines the height of the metal structure, with the oxide thickness beneath the etch becoming the metal-to-substrate spacing. The mask pattern determines the shape and location of the etch, so that, for example, an annular pattern produces an annular trench, or mold cavity 90, having vertical walls 92 and surrounding an island 94 which is centered over emitter 54, as illustrated in FIG. 9. The resist layer 86 is subsequently stripped in an $O_2$-plasma etch step.

Figure 10:
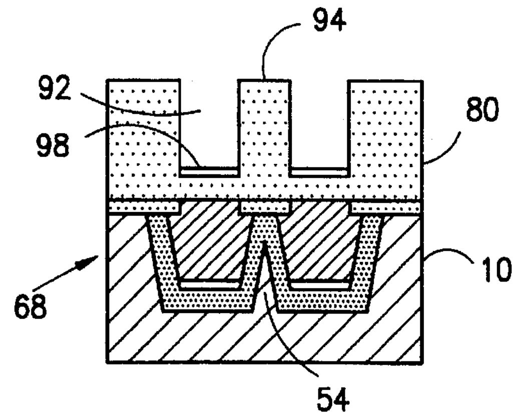
Figure 11:
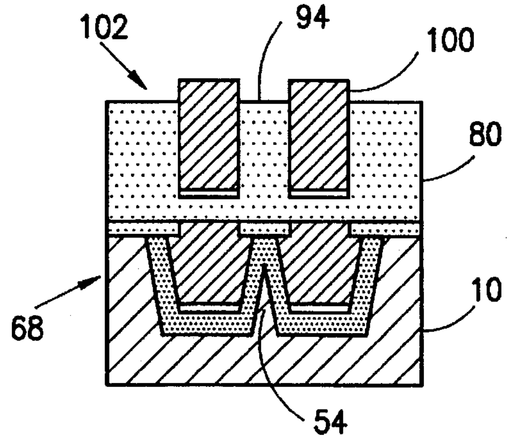

Silicon ions are implanted at a dosage of $10^{17}$ $cm^{-2}$ at 40 keV in the floor 96 of trench 92 to produce a shallow implanted region 98 (FIG. 10). Ions are also implanted on the surface of the silicon nitride layer 82, but this layer is removed using a short BHF dip followed by a longer hot phosphoric acid stripping step so that only the bottom surface 98 of the trench 90 within layer 80 is silicon-rich. This silicon-rich surface serves as a seed layer for the following step, illustrated in FIG. 11, which is a selective CVD tungsten deposition which fills the trench 90 to form a second-level tungsten electrode 100 (FIG. 11). As illustrated, the tungsten may overfill the trench 90, or may slightly underfill it so that the top surface 102 of the wafer is not smooth. The wafer is then mechanically polished, or a combination of a wet etch of the tungsten in hydrogen peroxide followed by mechanical polishing is used, to planarize the top surface of the wafer as illustrated at 104 in FIG. 12.

Figure 13:
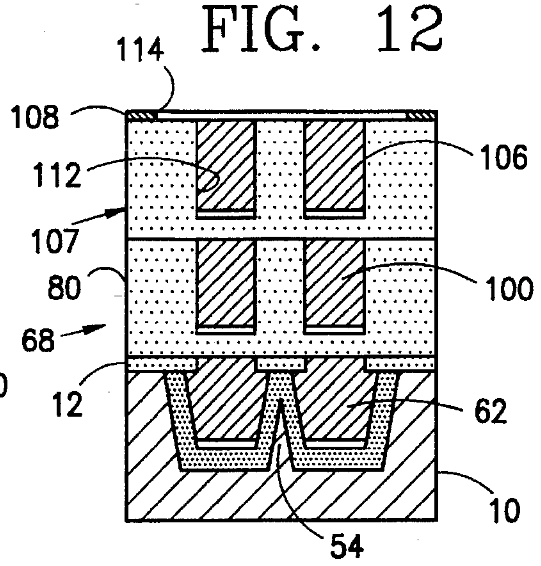
FIG. 13 illustrates a third-level planarized electrode for the device of FIG. 6.

The process described with respect to FIGS. 8–12 may be repeated to produce a third-level electrode in a third silicon layer 107 (FIG. 13), and additional levels as may be required for the emitter device. At each level, the respective silicon dioxide sacrificial layer thickness and the depth of the respective mold cavity is adjusted for the geometry of its corresponding electrode and to provide the required spacing between adjacent electrodes.

Figure 14:
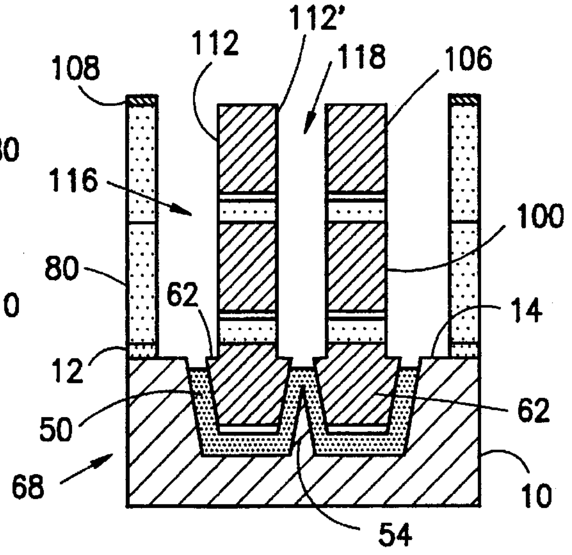
FIGS. 14 and 15 illustrate release of the three electrodes of FIG. 13.

After formation of all the desired electrode levels (for example, three levels in FIG. 13), the sacrificial $SiO_2$ layers are removed to release the electrodes and expose the emitter tip. First, a silicon carbide layer 108 is deposited to a thickness of about 300 nm by plasma-enhanced chemical vapor deposition (PECVD) on the planarized topmost surface of the wafer 68, for example surface 110 of the third level 107. A resist layer (not shown) is spun onto the top surface of layer 108 and is patterned by a conventional lithographic process to define a large window pattern surrounding outer diameter 112 of the tungsten electrode microstructure 106. This resist pattern is transferred to the silicon carbide layer 108 by $CF_4$ RIE to form a window mask 114. Thereafter, an MIE vertical etch using $CHF_3$ removes the silicon dioxide sacrificial layers within the mask window pattern 114 and surrounding the metal electrodes in the second, third and any subsequent levels of silicon dioxide above the wafer 10 to form the window trench 116, 118' illustrated in FIG. 14. The window trench portion 116 is annular and surrounds the electrodes, while window trench 118 extends through the centers of the electrodes. The window trenches extend through all the silicon dioxide layers, including layer 12, down to the top surface 14 of wafer 10 and, in addition, may etch away some of the oxide layer 50 surrounding the electrode 62, and frees both the outer diameter 112 and the inner diameter 112' of the electrodes.

Figure 15:
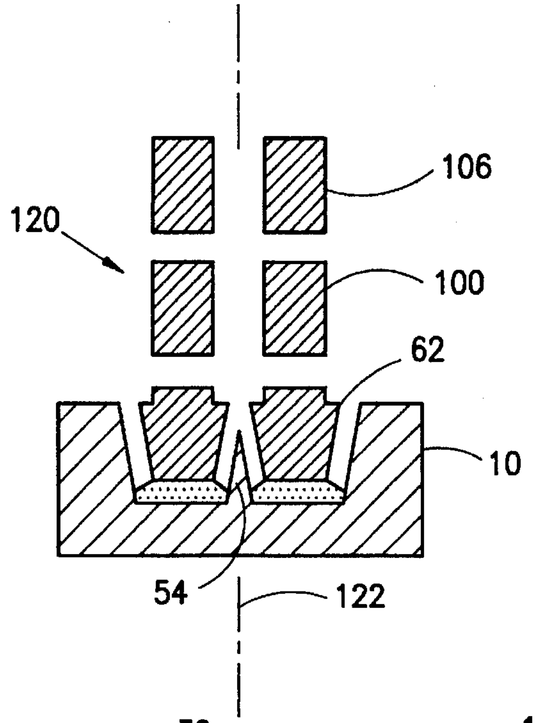

As a final step, the silicon dioxide sacrificial layers between the tungsten structures and covering the silicon tip 54 are removed in a BHF wet etch, leaving the released, self-aligned, multiple electrode microstructure 120 illustrated in FIG. 15. This structure includes electrode 62 surrounding emitter 54, with the released electrodes 100 and 106 being aligned with, spaced vertically above, and coaxial with electrode 62. The electrodes are coaxial with the vertical axis 122 of emitter 54, add thus surround the path of electrons emitted vertically from the emitter tip. The electrode microstructure features a self-aligned, first-level tungsten electrode and several levels of free-standing tungsten electrodes aligned with, and coaxial with, the first electrode.

Although only a single emitter 54 is illustrated in the foregoing figures, it will be understood that any number of electrodes can be fabricated on a single substrate, and preferably such electrodes will be arranged in an array in the manner described in U.S. Pat. No. 5,363,021 and 5,199,917, the disclosures of which are hereby incorporated herein by reference.

Figure 16:
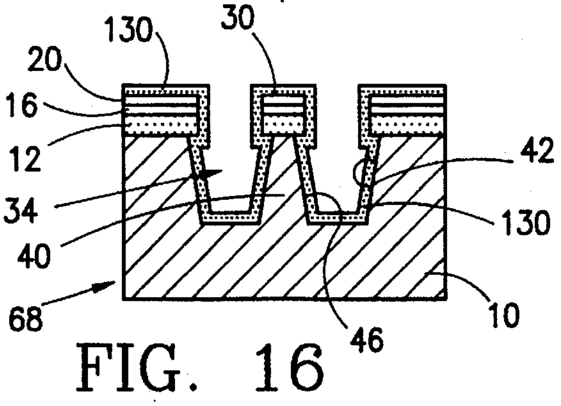
FIGS. 16–18 illustrate a modification of the process of FIGS. 1–5.
Figure 17:
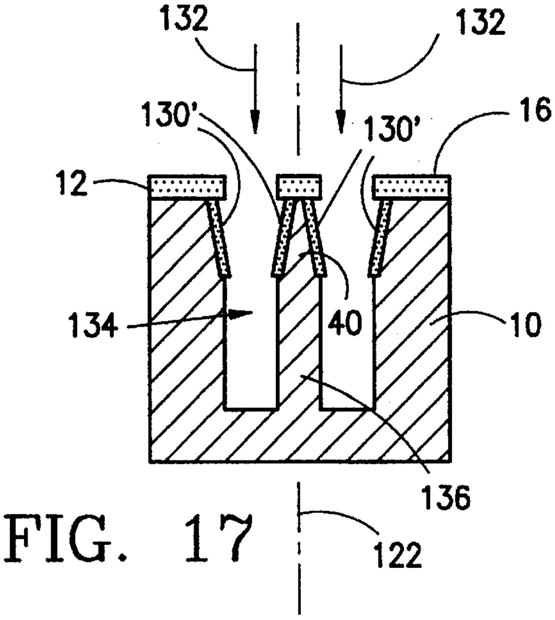

A modified emitter tip structure may be fabricated in the manner illustrated in FIGS. 16 and 17, by including three additional steps after the $SF_6$ undercut etch described above with respect to FIG. 3. The additional steps include deposition of a thin conformal layer 130 of silicon dioxide on the wafer 68, the layer 130 covering the top surface of layer 20, the sidewalls and floor of trench 34 and the island 30, as illustrated in FIG. 17. This conformal layer 130 is then etched by a vertical etch such as $CHF_3$-based RIE to remove all of the conformal layer except the sidewall layers 130' illustrated in FIG. 18. These sidewall layers 130' are located under the overhanging portions 36 and 38 of the etch mask layer 12 and thus are protected from the vertical etch. Thereafter, a $Cl_2$-based vertical RIE etch, indicated by arrows 132, is used to etch away the silicon substrate 10 to extend the trench 34 as indicated at 134, thereby forming a tall silicon support post, or pillar 136, with the emitter portion 40 remaining at the top of pillar 136. Thereafter, the thermal oxidation step described with respect to FIG. 4 is performed to form the emitter tip 54 in the manner described above.

Figure 18:
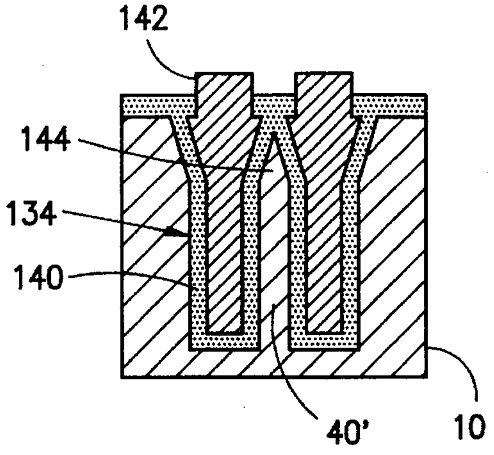
Figure 19:
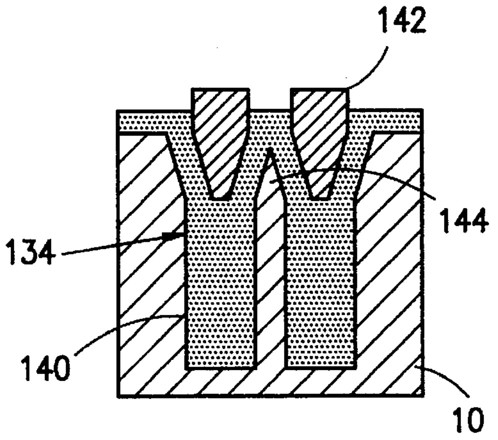
FIG. 19 illustrates a further modification of the process.
Figure 20:
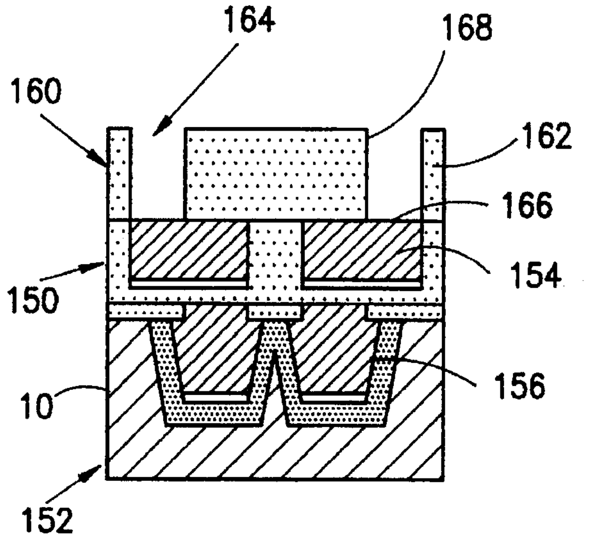
FIGS. 20 and 21 illustrate a process for fabricating modified electrode shapes.

Although the gate electrodes 62, 100 and 106 are illustrated as being generally cylindrical, as shown in FIGS. 1–15, it will be understood that the particular shape of the electrode will depend upon the shape of the trenches, or molds, in which they are formed. Thus, for example, the depth of the electrode 62 depends upon the depth of the trench formed by the vertical $Cl_2$ RIE of the silicon substrate 10. If this trench is so shallow or narrow that the oxide layer 50 formed by the emitter tip oxidation step of FIG. 4 nearly fills the trench, then the electrode 62 will have less depth, and will only be close to the top of emitter tip 54 (FIG. 15), while if the trench is deep and wide enough so that it is not filled by the silicon dioxide layer 50, the electrode will extend downwardly to surround the shank portion of the emitter, below its tip. Thus, for example, in the device of FIG. 17, the step of filling the trench 134 with tungsten after oxidation produces an electrode extending a significant distance along the axis 122 of the emitter and its support pillar. This is illustrated in FIG. 18, where the trench 134 is oxidized to produce a silicon dioxide layer 140 and the remaining cavity is filled with electrode material, such as tungsten 142, to form a deep, generally cylindrical electrode surrounding post 136, and its tip 144, which corresponds to tip 54 in FIG. 15 as illustrated in FIG. 19, however, if the duration of the oxidation step is extended so as to enlarge the silicon dioxide layer 140 to thereby partially fill the trench 134, the electrode 142 is shortened and surrounds only the tip 144.

Figure 21:
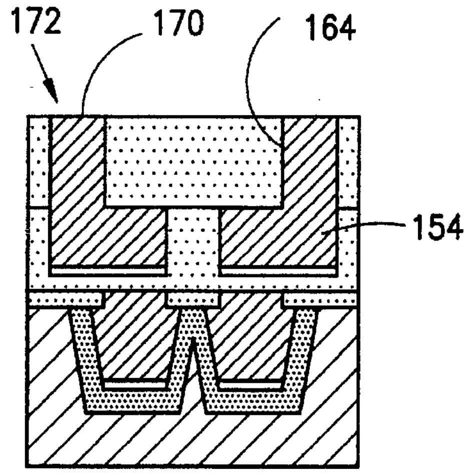

More complex electrode shapes can be generated by slightly modifying the process flow. Thus, for example, the pattern mask for a second level 150 of a wafer 152 may be modified to provide an enlarged second-level electrode 154. As illustrated, the second-level electrode may be wider than a first-level electrode 156, which may be similar to electrode 62. After planarization of this second level 150, a third level 160, for example, may be fabricated in the manner described above, as by depositing a sacrificial silicon dioxide layer 162. In this illustrated embodiment, the step of etching a trench mold in layer 162 is modified so that the resulting trench 164 extends completely through the thickness of silicon dioxide layer 162 to expose a top surface 166 of electrode 154. In this illustrated embodiment trench 164 has the same outer diameter as electrode 154, but has a larger inner diameter than the electrode, as indicated at 168. Thereafter, a third level electrode is deposited in trench mold 164 as illustrated at 170 in FIG. 21. This third level electrode 170 joins the underlying tungsten layer 154 to form an integral, vertically extended, variable diameter electrode having a complex cross-sectional shape, generally indicated at 172. The silicon implant step described above is not required for the third level electrode in this embodiment since the underlying tungsten layer is exposed and serves as the seed layer for the selective CVD step which deposits electrode 170. In this manner, any desired electrode shape composed of rectangular cross-sections can be fabricated by the present process.

Figure 22:
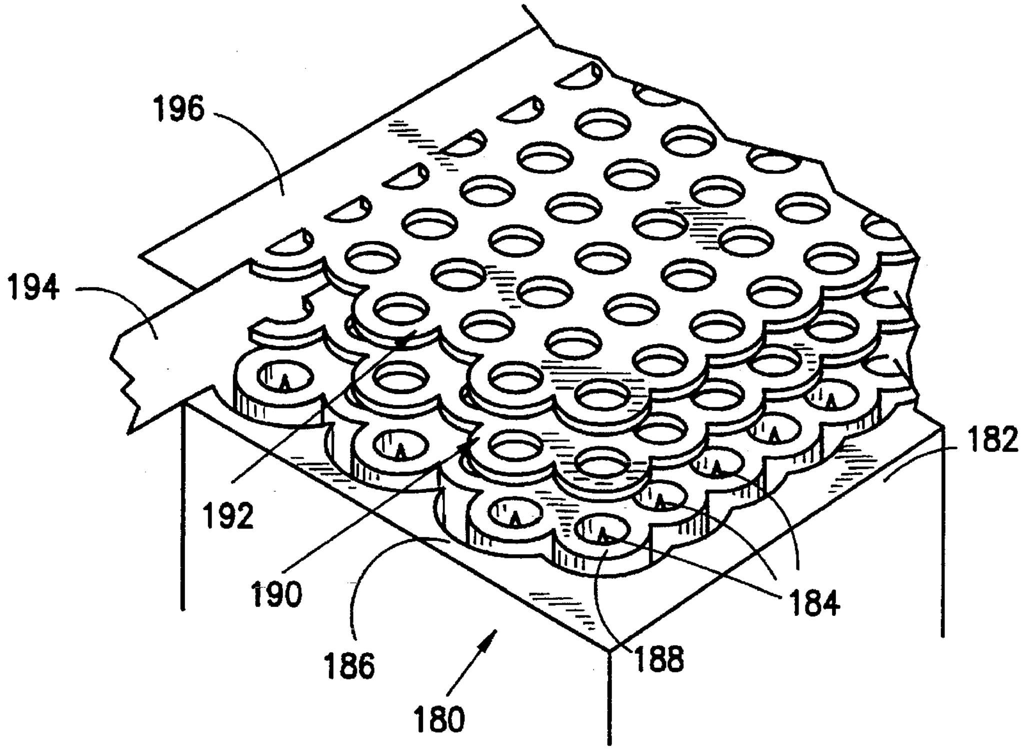
FIG. 22 is a diagrammatic perspective view of an emitter array incorporating a three-level electrode structure.

FIG. 22 illustrates a diagrammatic perspective view of an emitter array 180 fabricated in accordance with the foregoing procedure. A substrate 182 incorporates multiple emitter tips 184 fabricated at the surface 186 of the substrate. A first level electrode 188 is formed in the substrate surrounding the emitters, and second and third level electrodes 190 and 192 are fabricated above electrode 188, as illustrated. The electrodes 190 and 192 extend from and are supported by a support structure such as a side wall 194 adjacent, or formed as a part of, substrate 182. Preferably, the electrodes are connected to corresponding contact pads 196 by which the electrodes are connected to external control circuitry (not shown). It will be understood that the emitters and the electrodes can be divided into segments for selective control of emitted electrons. It will also be understood that the substrate 182 may be a movable microelectromechanical structure such as that described in Ser. No. 08/069725, now U.S. Pat. No. 5,536,988, for controlled motion of the emitter array.

The process of the present invention is not limited to the use of selective tungsten CVD, but can also be used in combination with other selective metal deposition technologies, such as, for example, electroless deposition of metals such as copper or nickel. This latter technique requires only two modifications. First, the appropriate see layer must be used; for example, Cu for copper, Au for nickel. Second, the appropriate deposition technology (for example evaporation and electroless deposition) must be substituted for the silicon implantation and selective tungsten CVD steps described above.

For low-temperature selective metal deposition technologies, polyimide or similar organic materials can be substituted for silicon dioxide as the sacrificial layer 12 and all other $SiO_2$ sacrificial layers described above. This increases the vertical dimensions of devices that can be fabricated because of the very low stress in organic films and the possibility of depositing very thick films. The process can also be extended to accommodate non-selective metal deposition technologies currently in use for VLSI vias and interconnects, wherein a planar blanket film, such as copper, tungsten, or aluminum, is deposited and then removed using etch-back by RIE or chemical-mechanical polishing, leaving behind the metal in the trenches. If polyimide is deposited as a sacrificial layer, it is reflowed to create a planar surface on which a planar blanket metal film is deposited. The electrode pattern is then etched into the film using a vertical, selective etch and then another polyimide layer is deposited and reflowed to create a planar surface for the next electrode deposition.

Although the present invention has been described in terms of preferred embodiments thereof, it will be understood that the process can be used to fabricate a variety of vacuum microelectronic devices. Electronoptical microcolumns with varying numbers and geometric arrangements of planar electrodes can be fabricated and the process is equally suitable for the fabrication of microvacuum triodes, retrodes, pentodes, etc. These devices may be used as high-speed amplifying switching devices, can be used in the fabrication of addressable field-emitting arrays for flat-panel displays, and may be used for field emission and tunneling sensors integrated with MEMS devices. Thus, the present invention is limited only by the following claims.

What is claimed is:

1. A process for fabricating microelectronic sources, comprising:

producing in a substrate a first trench surrounding an island;

oxidizing said substrate within said trench to form in said island an emitter tip and an oxide layer to define a first sacrificial mold layer;

selectively depositing a first-level metal electrode on said mold layer, said electrode surrounding and being self-aligned with said emitter; and planarizing said substrate and first-level electrode.

2. The process of claim 1, further including:

producing on said upper surface a second sacrificial mold layer containing a second trench surrounding said emitter;

selectively depositing a second-level metal electrode in said second mold trench, said second-level electrode surrounding said emitter and being spaced above said first-level electrode; and planarizing said second-level electrode.

3. The process of claim 2, further including removing said second sacrificial mold layer and at least a portion of said first sacrificial mold layer to expose said emitter and first- and second-level electrodes.

4. The process of claim 3, wherein said emitter has a diameter of about 20 nm, an wherein said first-level electrode is spaced about 400 nm from said emitter.

5. The process of claim 3, wherein planarizing said first- and second-level electrodes includes mechanical polishing.

6. The process of claim 2, further including depositing a third sacrificial mold layer containing a third-trench surrounding said emitter on said planarized second-level electrode;

selectively depositing a third-level metal electrode in said third mold trench, said third electrode surrounding said emitter and being spaced above said second-level electrode; and removing said third sacrificial mold layer, said second sacrificial mold layer and at least a portion of said first sacrificial mold layer to expose said emitter and said first-, second- and third-level electrodes.

7. A process for fabricating a vacuum microelectronic device, comprising:

producing on a substrate an etch mask having a pattern which defines the shape, location, and size of an emitter and surrounding electrode;

etching said substrate through said mask to produce an undercut trench having a floor and upwardly and outwardlytapering walls surrounding an emitter post having inwardly tapering walls;

oxidizing said trench walls to produce an oxide layer on said walls and to produce within said emitter post a tapered emitter tip, the oxide layer enclosing an electrode cavity mold having an oxide floor and walls surrounding said emitter post;

implanting the floor of said cavity with a seed layer;

selectively depositing metal in said cavity, said metal bonding with said seed layer to produce metal electrode surrounding said emitter tip;

planarizing said first level;

fabricating at least a second level electrode coaxial with and spaced above said first level electrode by depositing on said planarized surface a second level oxide layer, etching an electrode trench, oxidizing said trench to form a second cavity mold, implanting a seed material in said second cavity, and depositing metal in said second cavity to form said second level electrode;

planarizing said second level; and releasing said first and second level electrodes.

8. The process of claim 7, further including fabricating at least a third level electrode coaxial with and spaced above said first and second level electrodes.

9. The process of claim 7, further including depositing a thin conformal layer of oxide on said undercut trench;

removing the portion of said conformal layer on said trench floor by a vertical etch to expose said substrate;

etching said substrate to deepen said undercut trench to thereby form a silicon support post beneath said emitter post; and thereafter oxidizing said trench walls.

10. The invention of claim 7, wherein releasing said electrodes includes:

forming a window trench around and within said electrodes to expose inner and outer surfaces of said electrodes; and etching away oxide between adjacent electrodes and between said electrodes and said emitter to thereby produce a released self-aligned, multiple electrode microstructure.

* * * * *